(12) United States Patent
Shih et al.

(10) Patent No.: US 8,536,531 B2
(45) Date of Patent: Sep. 17, 2013

(54) PROXIMITY SENSING APPARATUS AND SENSING METHOD THEREOF

(75) Inventors: Cheng-Chung Shih, Fremont, CA (US); Koon-Wing Tsang, Fremont, CA (US)

(73) Assignee: Capella Microsystems, Corp., Tortola (VG)

( * ) Notice: Subject to any disclaimer, the term of this patent is extended or adjusted under 35 U.S.C. 154(b) by 250 days.

(21) Appl. No.: 13/117,574

(22) Filed: May 27, 2011

(65) Prior Publication Data

US 2012/0298869 A1 Nov. 29, 2012

(51) Int. Cl.
*G01J 5/02* (2006.01)

(52) U.S. Cl.
USPC ...................................................... 250/341.8

(58) Field of Classification Search
USPC ...................................................... 250/341.8
See application file for complete search history.

(56) References Cited

U.S. PATENT DOCUMENTS

2010/0245289 A1* 9/2010 Svajda .......................... 345/175

* cited by examiner

*Primary Examiner* — David Porta
*Assistant Examiner* — Hugh H Maupin
(74) *Attorney, Agent, or Firm* — Muncy, Geissler, Olds & Lowe, PLLC (57) ABSTRACT

The present invention discloses a proximity sensing apparatus and a method thereof. The proximity sensing apparatus comprises a panel, a first light-emitting unit, a second light-emitting unit and a sensing unit. The panel comprises a plurality of transparent areas. The first light-emitting unit is located at one side of the panel and emits a plurality of first light signals through one of the transparent areas. The second light-emitting unit is located at the same side as the first light-emitting unit of the panel and emits a plurality of second light signals through one of the transparent areas. The sensing unit is located at the same side as the first light-emitting unit of the panel and senses the reflected first light signals or the reflected second light signals reflected by an object. Wherein, the sensing unit is closer to the first light-emitting unit than to the second light-emitting unit.

20 Claims, 10 Drawing Sheets

PROXIMITY SENSING APPARATUS AND SENSING METHOD THEREOF

BACKGROUND OF THE INVENTION

1. Field of the Invention

The exemplary embodiment(s) of the present invention relates to a sensor apparatus and a method thereof. More specifically, the exemplary embodiment(s) of the present invention relates to a proximity sensing apparatus and a sensing method thereof.

2. Description of Related Art

In recent years, the LED technology has big progress in the brightness efficiency, and many applications for displays continuously appear. Also, the optical proximity sensor (OPS) apparatus is commonly used in wireless communications, bio-molecular sciences, environmental monitoring, and displays. The OPS apparatus is developed based on the light signal received by the photo-detector (PD) via the reflections of the measured object. The PD transfers the light signal to the electrical signal. By detecting the intensity of the electrical signal, the OPS apparatus can calculate the distance of measured object.

Figure 1:
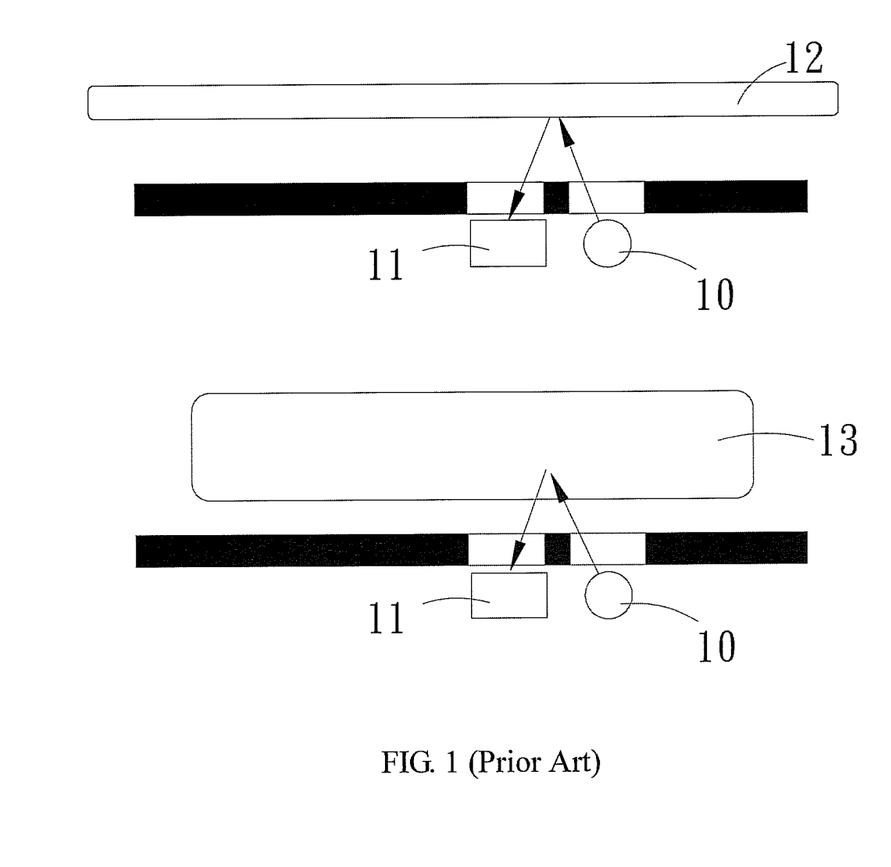
FIG. 1 is a schematic view illustrating a structure of a conventional optical proximity sensor.

The conventional OPS apparatus is mainly used for switches; for example, an OPS apparatus can detect whether a cover is close to the display of an electronic device, and then the electronic device can automatically turn off the display for power saving. However, there are limitations for conventional OPS apparatus. Please refer to FIG. 1 which is a schematic view illustrating a structure of a conventional optical proximity sensor. As shown, the conventional OPS apparatus usually has one light emitting unit 10 and one proximity sensor 11. The proximity sensor 11 can be used as cover closure detector and automatically turn off the display when a cover 12 is close to the display. However, while a human body such as a hand 13 is close to the display, the electronic device may also shut down the display. Therefore, by this detecting method, hand holding of the electronic device may be sometimes falsely detected as a cover and shut down the display unintentionally. The phenomenon mentioned above is an unwanted drawback for all the users.

Thus, for the demand, designing a proximity sensing apparatus and a sensing method thereof to increases the accuracy of an OPS apparatus has become an urgent issue for the application in the market.

SUMMARY OF THE INVENTION

A proximity sensing apparatus is disclosed. The proximity sensing apparatus comprises a panel, a first light-emitting unit, a second light-emitting unit and a sensing unit. The panel comprises a plurality of transparent areas. The first light-emitting unit is located at one side of the panel and emits a plurality of first light signals through one of the plurality of transparent areas. The second light-emitting unit is located at the same side as the first light-emitting unit of the panel and emits a plurality of second light signals through one of the plurality of transparent areas. The sensing unit is located at the same side as the first light-emitting unit of the panel and senses the reflected first light signals or the reflected second light signals reflected by an object, wherein the reflected first light signals or the reflected second light signals pass through one of the plurality of transparent areas. In addition, the sensing unit is closer to the first light-emitting unit than to the second light-emitting unit.

In this invention, a proximity sensing method is further provided, comprising the following steps: providing a panel with a plurality of transparent areas; emitting a plurality of first light signals through one of the plurality of transparent areas by a first light-emitting unit being located at one side of the panel; emitting a plurality of second light signals through one of the plurality of transparent areas by a second light-emitting unit being located at the same side as the first light-emitting unit of the panel; and sensing the reflected first light signals or the reflected second light signals reflected by an object by a sensing unit being located at the same side as the first light-emitting unit of the panel, wherein the reflected first light signals or the reflected second light signals passing through one of the plurality of transparent areas. In addition, the sensing unit is closer to the first light-emitting unit than to the second light-emitting unit.

With these and other objects, advantages, and features of the invention that may become hereinafter apparent, the nature of the invention may be more clearly understood by reference to the detailed description of the invention, the embodiments and to the several drawings herein.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PREFERRED EMBODIMENTS

Exemplary embodiments of the present invention are described herein in the context of a proximity sensing apparatus and a sensing method thereof.

Those of ordinary skilled in the art will realize that the following detailed description of the exemplary embodiment(s) is illustrative only and is not intended to be in any way limiting. Other embodiments will readily suggest themselves to such skilled persons having the benefit of this disclosure. Reference will now be made in detail to implementations of the exemplary embodiment(s) as illustrated in the accompanying drawings. The same reference indicators will be used throughout the drawings and the following detailed description to refer to the same or like parts.

Figure 2:
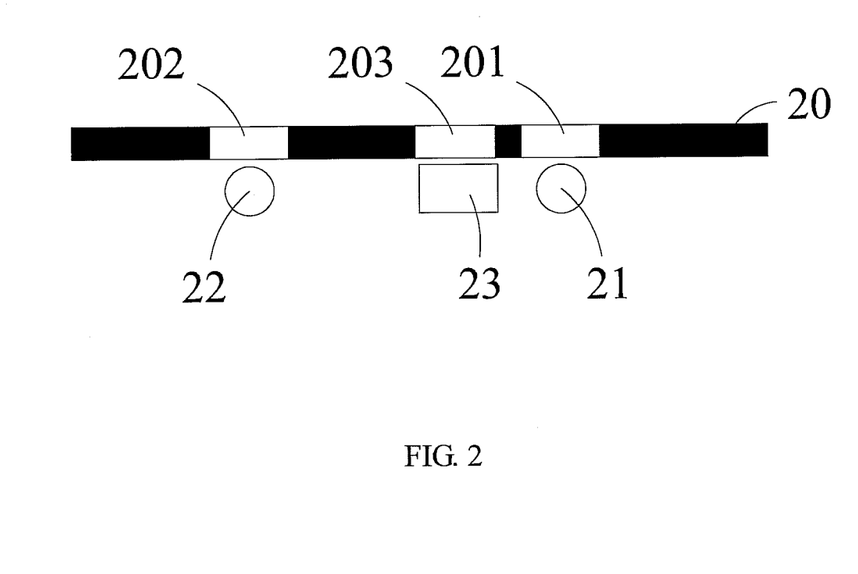
FIG. 2 is a schematic view illustrating a first embodiment of a structure of a proximity sensing apparatus according to the present invention.

Please refer to FIG. 2 which is a schematic view illustrating a first embodiment of a structure of a proximity sensing apparatus according to the present invention. As shown in the figure, the proximity sensing apparatus 2 comprises a panel 20, a first light-emitting unit 21, a second light-emitting unit 22 and a sensing unit 23. In the first embodiment, the panel 20 comprises three infrared transparent areas, a first infrared transparent area 201, a second infrared transparent area 202 and a third infrared transparent area 203. The first light-emitting unit 21 is located at one side of the panel 20; the second light-emitting unit 22 is located at the same side as the first light-emitting unit 21 of the panel 20; the sensing unit 23 is located at the same side as the first light-emitting unit 21 of the panel 20. Also, the sensing unit 23 is closer to the first light-emitting unit 21 than to the second light-emitting unit 22. In addition, in the first embodiment, the first light-emitting unit 21 and the second light-emitting unit 22 may be infrared light-emitting diodes (IR LEDs), and the embodiments describing the IR LEDs are only examples without limit to this invention.

Figure 3:
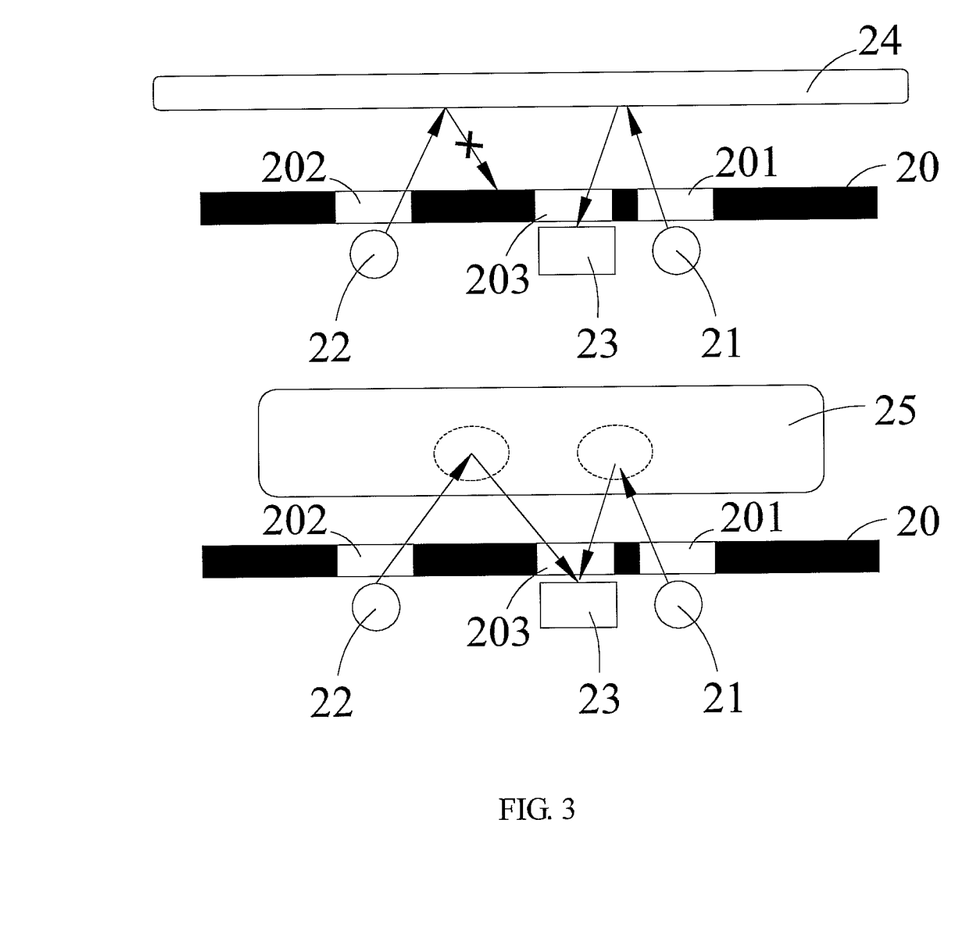
FIG. 3 is a schematic view illustrating a first embodiment of a structure of a proximity sensing apparatus with two different objects according to the present invention.

Please refer to FIG. 3 which is a schematic view illustrating a first embodiment of a structure of a proximity sensing apparatus with two different objects according to the present invention. As shown in the figure, the first light-emitting unit 21 emits a plurality of first light signals through the first infrared transparent area 201; the second light-emitting unit 22 emits a plurality of second light signals through the second infrared transparent area 202. While a solid cover 24 is moved from somewhere to a position close to the panel 20, some of the first light signals may be reflected by the solid cover 24, and pass through the third infrared transparent area 203. Then, the reflected first light signals passing through the third infrared transparent area 203 may be received and sensed by the sensing unit 23. However, since the solid cover 24 can only reflect light, the second light signals reflected by the solid cover 24 can not pass through the third infrared transparent area 203, and can not be received and sensed by the sensing unit 23. That is, for solid cover 24, the sensing unit 23 can only detect light from the first light-emitting unit 21 (i.e. the near light-emitting unit) not the second light-emitting unit 22 (i.e. the far light-emitting unit) due to the viewing angle of the sensing unit 23.

While a human body such as a hand 25 is moved from somewhere to a position close to the panel 20, some of the first light signals may be reflected by the hand 25, and pass through the third infrared transparent area 203. Then, the reflected first light signals passing through the third infrared transparent area 203 may be received and sensed by the sensing unit 23. Similarly, some of the second light signals may be reflected by the hand 25, and pass through the third infrared transparent area 203. Then, the reflected second light signals passing through the third infrared transparent area 203 may be received and sensed by the sensing unit 23. That is, for human body 25, the sensing unit 23 can detect light signals both from the first light-emitting unit 21 and the second light-emitting unit 22 because IR light can penetrate a human body. Therefore, an electronic device such as a tablet PC with the proximity sensing apparatus 2 can easily distinguish the difference between a solid cover 24 and a hand 25, and then automatically, correctly turn off the display when the tablet PC is not used.

In addition, the first light-emitting unit 21 and the second light-emitting unit 22 can sequentially emit the plurality of first light signals and the plurality of second light signals respectively. Please refer to FIG. 4 which is a timing diagram illustrating an embodiment of two light-emitting units emitting light signals at different timing according to the present invention. As shown in the figure, in the embodiment, at a snapshot of timing N, N+1 and N+2, the first light-emitting unit 21 may emit the first light signals with a certain voltage in duration T1, and the second light-emitting unit 22 may subsequently emit the second light signals with a certain voltage in duration T2. The timing sequence 41 shows that the first light-emitting unit 22 emits the first light signals; the timing sequence 42 shows that the second light-emitting unit 22 emits the second light signals.

Figure 4:
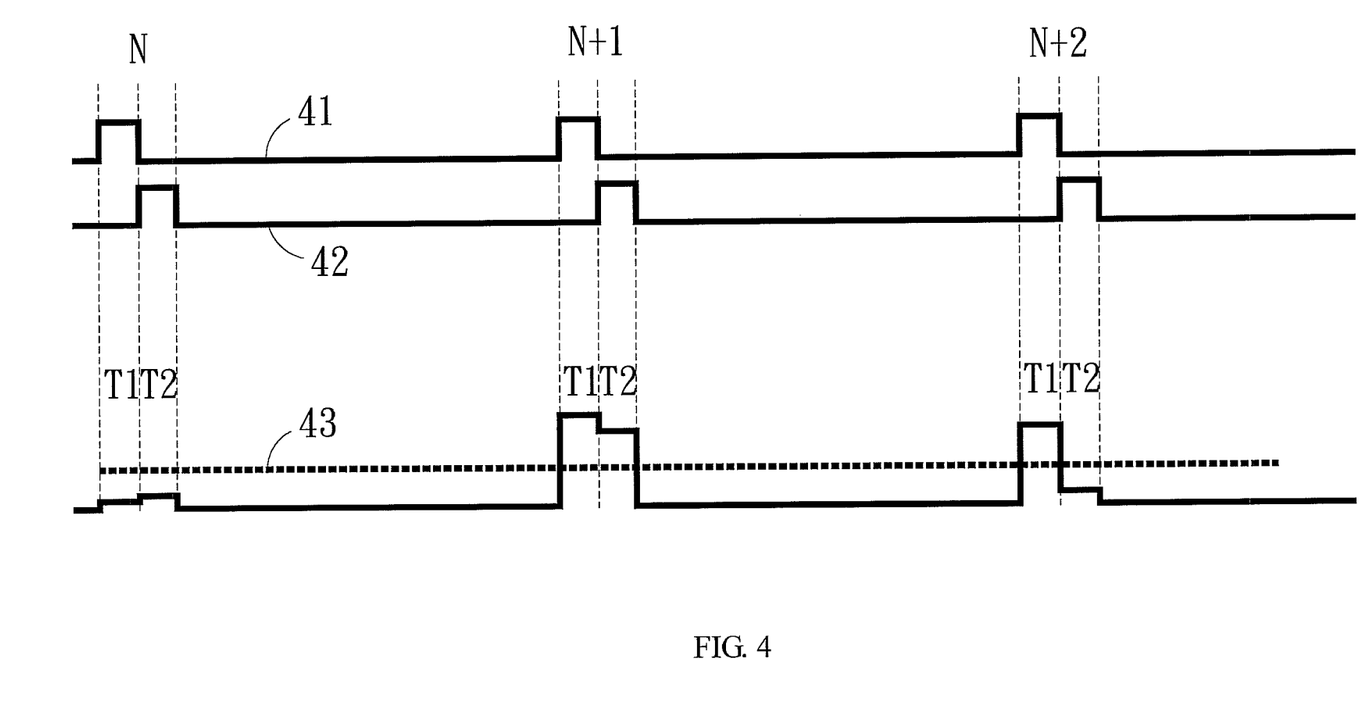
FIG. 4 is a timing diagram illustrating an embodiment of two light-emitting units emitting light signals at different timing according to the present invention.

Moreover, the proximity sensing apparatus 2 may further be connected with a processing unit (not shown in the figure) having a threshold 43. While no solid cover 24 or hand 25 is close to the panel 20 at the snapshot of timing N, very few light signals may pass through the third infrared transparent area 203, and barely be sensed by the sensing unit 23. While a hand 25 is close to the panel 20 at the snapshot of timing N+1, some of the first light signals and some of the second light signals are reflected by the hand 25. Then, the reflected first light signals and reflected second light signals passing through the third infrared transparent area 203 are received and sensed by the sensing unit 23. The processing unit determines that the voltages sensed by the sensing unit 23 are both larger than the threshold 43. While a solid cover 24 is close to the panel 20 at the snapshot of timing N+2, some of the first light signals are reflected by the solid cover 24, pass through the third infrared transparent area 203, and are received and sensed by the sensing unit 23. However, the reflected second light signals can not pass through the third infrared transparent area 203, and can not be received and sensed by the sensing unit 23. The processing unit determines that only one voltage that caused by some of the reflected first light signals and sensed by the sensing unit 23 is larger than the threshold 43. Therefore, an electronic device such as a tablet PC with the proximity sensing apparatus 2 can easily distinguish the difference between a solid cover 24 and a hand 25, and then automatically, correctly turn off the display when the tablet PC is not used.

It is worth noting that the processing unit may comprises two different thresholds for determining whether the voltages that caused by the reflected first light signals and the reflected second light signals sensed by the sensing unit are larger than the thresholds or not respectively. Also, the thresholds are changeable depending on different situation. The embodiment of thresholds in the previous statement should be considered as the example but not the limitation.

Figure 5:
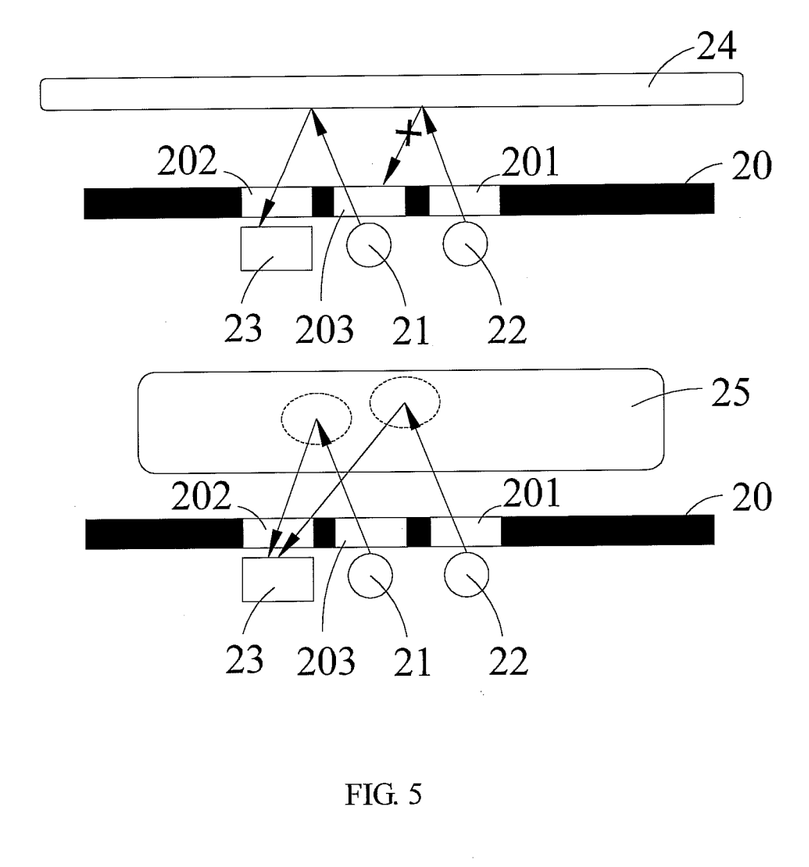
FIG. 5 is a schematic view illustrating a second embodiment of a structure of a proximity sensing apparatus with two different objects according to the present invention.
Figure 6:
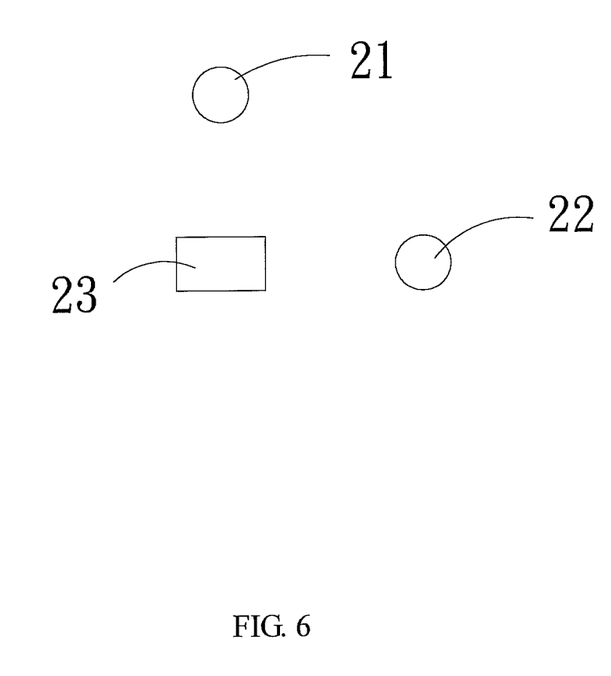
FIG. 6 is a schematic view illustrating a third embodiment of a partial structure of a proximity sensing apparatus from birds view according to the present invention.

Please refer to FIG. 3, FIG. 5 and FIG. 6. FIG. 5 is a schematic view illustrating a second embodiment of a structure of a proximity sensing apparatus with two different objects according to the present invention. FIG. 6 is a schematic view illustrating a third embodiment of a partial structure of a proximity sensing apparatus from birds view according to the present invention. As shown in the FIG. 3, the first light-emitting unit 21 may be located at one side of the sensing unit 23, and the second light-emitting unit 22 may be located at the other side of the sensing unit 23. Similarly, as shown in FIG. 5, the first light-emitting unit 21 and the second light-emitting unit 22 may be both located at the same side of the sensing unit 23. Likewise, as shown in FIG. 6, the first light-emitting unit 21, the second light-emitting unit 22 and the sensing unit 23 may be in an L shape from birds view, wherein the sensing unit 23 may be in a corner of the L shape, and the first light-emitting unit 21 and the second light-emitting unit 22 may be in two ends of the L shape respectively. Also, the functions of the proximity sensing apparatus 2 are described in detail above, so unnecessary details are not given here.

Figure 7:
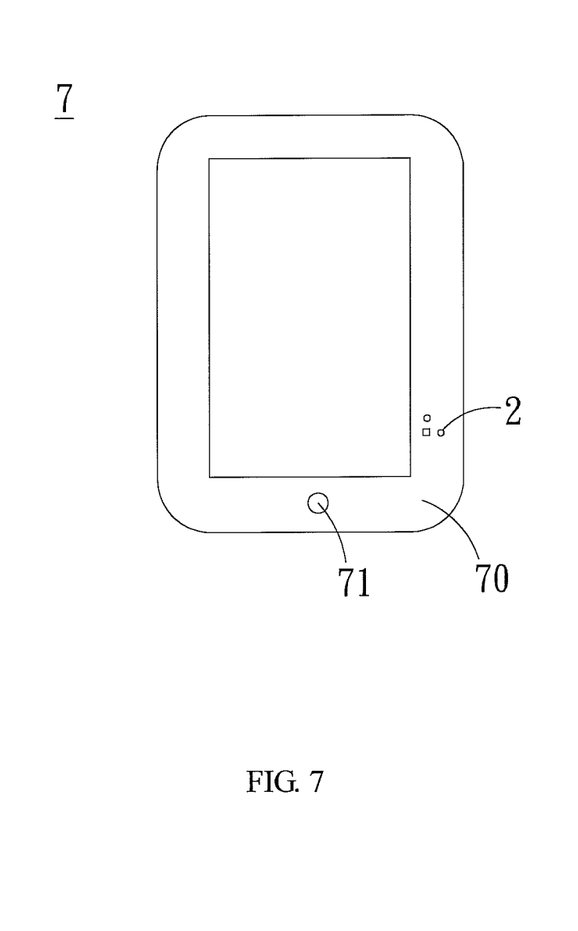
FIG. 7 is a schematic view illustrating an embodiment of an electronic device with the proximity sensing apparatus according to this invention.

Please refer to FIG. 7 which is a schematic view illustrating an embodiment of an electronic device with the proximity sensing apparatus according to this invention. As shown in the figure, the electronic device 7 according to this invention comprises a body 70, an input means 71, and at least one proximity sensing apparatus 2. The proximity sensing apparatus 2 is provided on the body 70. The proximity sensing apparatus 2 comprises the first light-emitting unit, the second light-emitting unit and the sensing unit. The proximity sensing apparatus 2 is described in detail above, so unnecessary details are not given here. It is nevertheless especially noted that the electronic device 7 according to this invention may be a tablet with a touch function and the like. In the embodiment, the tablet 7 with the at least one proximity sensing apparatus 2 may shut down the screen once the tablet 7 detects cover closure. Afterward, if a user would like to turn the screen back on, the user may manually push input means 71. The tablet 7 disclosed in this invention is an only example without limit to this invention; those who are skilled in the art may easily replace the device with another device for operating with the at least one proximity sensing apparatus 2 according to this invention.

Figure 8:
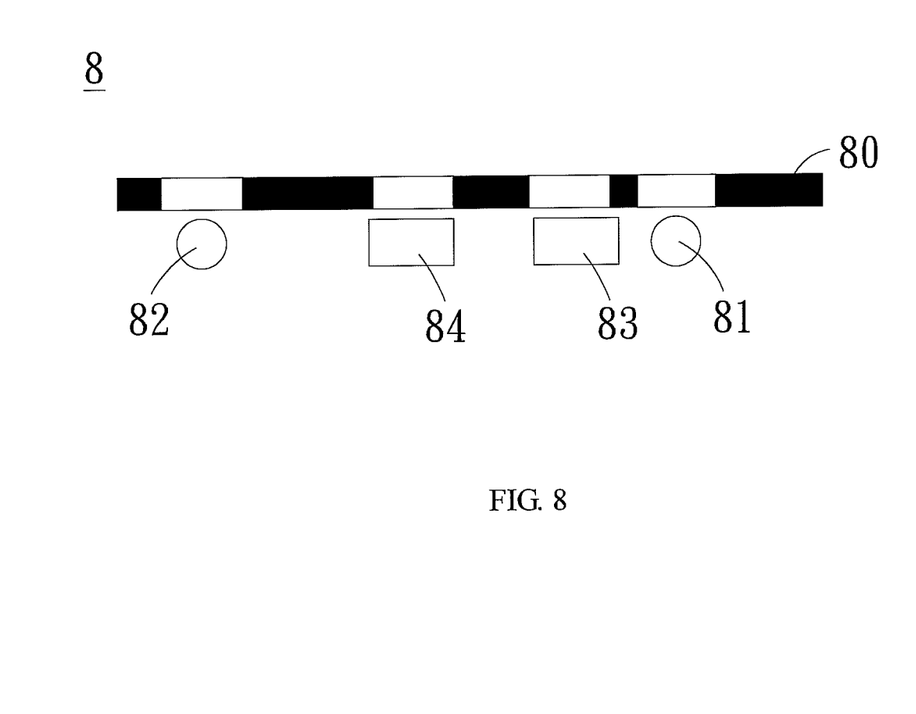
FIG. 8 is a schematic view illustrating a fourth embodiment of a structure of a proximity sensing apparatus according to the present invention.

Please refer to FIG. 8 which is a schematic view illustrating a fourth embodiment of a structure of a proximity sensing apparatus according to the present invention. As shown in the figure, the proximity sensing apparatus 8 may comprise a panel 80, a first light-emitting unit 81, a second light-emitting unit 82, a first sensing unit 83 and a second sensing unit 84. The functions of the proximity sensing apparatus are described in detail above, so unnecessary details are not given here. However, in the embodiment, the first sensing unit 83 may receive and sense the reflected light signals from the first light-emitting unit 81 while an object is close to the panel 80, and the second sensing unit 84 may receive and sense the reflected light signals from the second light-emitting unit 82 while an object is close to the panel 80. Also, it is apparent to those who are skilled in the art that the embodiments describing the numbers of light-emitting unit and sensing units are only examples without limit to this invention.

Figure 9:
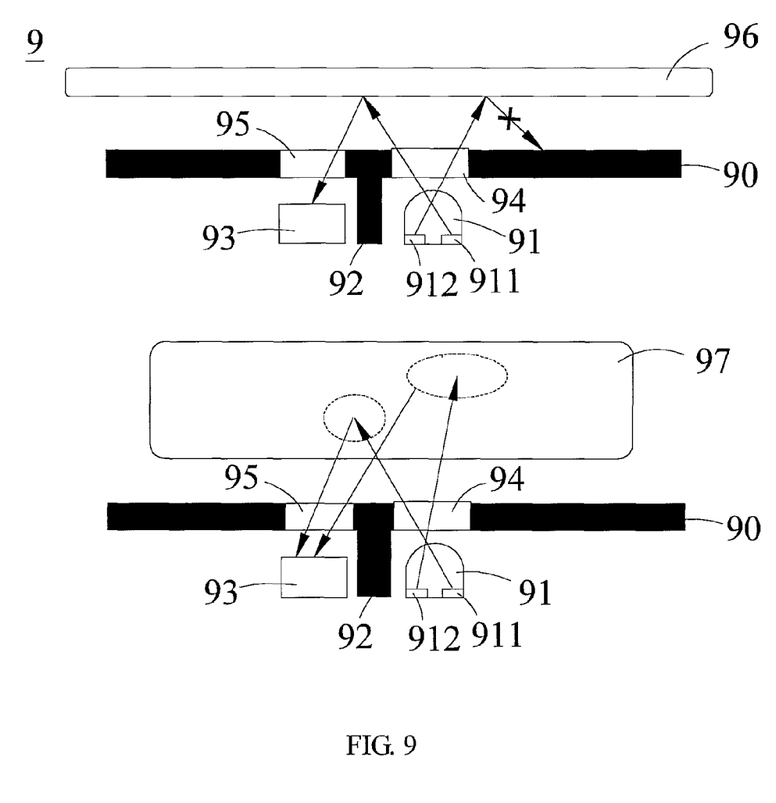
FIG. 9 is a schematic view illustrating a fifth embodiment of a structure of a proximity sensing apparatus with two different objects according to the present invention.

Please refer to FIG. 9 which is a schematic view illustrating a fifth embodiment of a structure of a proximity sensing apparatus with two different objects according to the present invention. As shown in the figure, the proximity sensing apparatus 9 may comprise a panel 90, a light-emitting module 91, a supporting unit 92 and a sensing unit 93. The light-emitting module 91 may comprise a first light-emitting unit 911 and a second light-emitting unit 912; wherein the first light-emitting unit 911 and the second light-emitting unit 912 may be at the opposite corner inside the light-emitting module 91, and the first light signals and the second light signals are emitted through the first transparent area 94 at plurality of different angles. In the embodiment, the reflected light signals emitted by the second light-emitting unit 912 can not pass the second transparent area 95 while a solid cover 96 is close to the panel 90; however, the reflected light signals emitted by the second light-emitting unit 912 can pass the second transparent area 95 while a human body such as a hand 97 is moved from somewhere to a position close to the panel 90. Therefore, an electronic device such as a tablet PC with the proximity sensing apparatus 2 can easily distinguish the difference between a solid cover 24 and a hand 25, and then automatically, correctly turn off the display when the tablet PC is not used.

Although the proximity sensing apparatus according to this invention is described above and a proximity sensing method is described, for the details, a flow chart is described in detail below.

Figure 10:
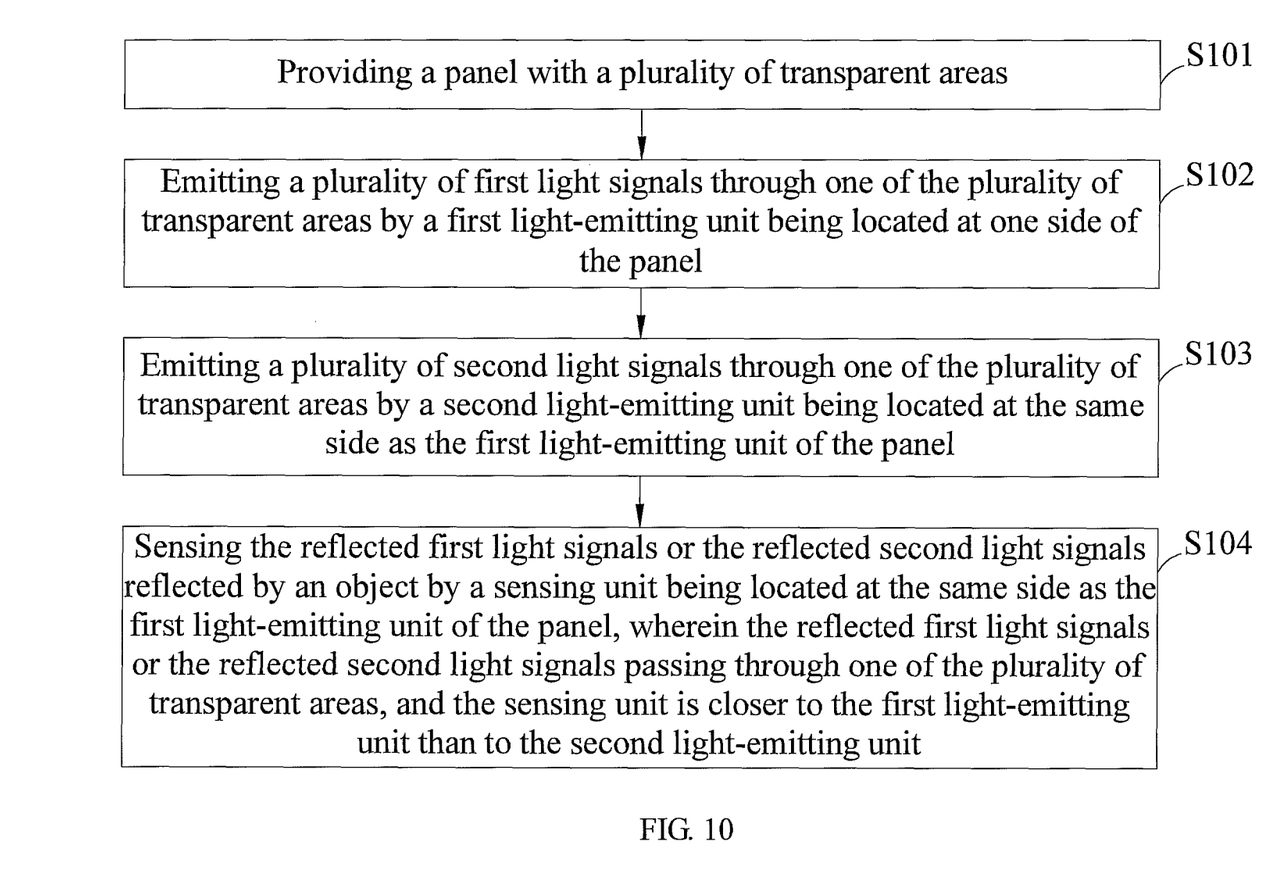
FIG. 10 is a flow chart of a proximity sensing method according to this invention.

Refer to FIG. 10 as a flow chart of a proximity sensing method according to this invention. As show in the chart, the proximity sensing method according to this invention is applied to the proximity sensing apparatus. The proximity sensing apparatus comprises a panel, a first light-emitting unit, a second light-emitting unit and a sensing unit. The proximity sensing method comprises the following steps:

(S101) providing a panel with a plurality of transparent areas;

(S102) emitting a plurality of first light signals through one of the plurality of transparent areas by a first light-emitting unit being located at one side of the panel;

(S103) emitting a plurality of second light signals through one of the plurality of transparent areas by a second light-emitting unit being located at the same side as the first light-emitting unit of the panel; and (S104) sensing the reflected first light signals or the reflected second light signals reflected by an object by a sensing unit being located at the same side as the first light-emitting unit of the panel, wherein the reflected first light signals or the reflected second light signals passing through one of the plurality of transparent areas, and the sensing unit is closer to the first light-emitting unit than to the second light-emitting unit.

The detailed description and embodiments of proximity sensing method for the proximity sensing apparatus according to this invention are given above, and so unnecessary details are not given here.

To sum up, the proximity sensing apparatus with two LEDs located with different viewing angle can solve hand false trigger situation. That is, it will not false trigger and turn the screen back on by mistake. Also, it will allow the cover closure detection much faster.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope of all such changes and modifications as are within the true spirit and scope of the exemplary embodiment(s) of the present invention.

What is claimed is:

1. A proximity sensing apparatus, comprising:
    a panel comprising a plurality of transparent areas;
    a first light-emitting unit being located at one side of the panel and emitting a plurality of first light signals through one of the plurality of transparent areas;
    a second light-emitting unit being located at the same side as the first light-emitting unit of the panel and emitting a plurality of second light signals through one of the plurality of transparent areas; and
    a sensing unit being located at the same side as the first light-emitting unit of the panel and sensing the reflected first light signals or the reflected second light signals reflected by an object, the reflected first light signals or the reflected second light signals passing through one of the plurality of transparent areas;
    wherein the sensing unit is closer to the first light-emitting unit than to the second light-emitting unit.

2. The proximity sensing apparatus as claimed in claim 1, wherein the first light-emitting unit, the second light-emitting unit and the sensing unit is in an L shape, the sensing unit is in a corner of the L shape, and the first light-emitting unit and the second light-emitting unit are in two ends of the L shape respectively.

3. The proximity sensing apparatus as claimed in claim 1, wherein the first light-emitting unit is located at one side of the sensing unit, and the second light-emitting unit is located at the other side of the sensing unit.

4. The proximity sensing apparatus as claimed in claim 1, wherein the first light-emitting unit and the second light-emitting unit are both located at one side of the sensing unit.

5. The proximity sensing apparatus as claimed in claim 1, wherein the first light-emitting unit and the second light-emitting unit sequentially emit the plurality of first light signals and the plurality of second light signals respectively.

6. The proximity sensing apparatus as claimed in claim 1, wherein the proximity sensing apparatus further being connected with a processing unit having at least one threshold; wherein the processing unit determines whether the reflected first light signals or the reflected second light signals sensed by the sensing unit is larger than the at least one threshold.

7. The proximity sensing apparatus as claimed in claim 6, wherein the processing unit determines that the reflected first light signals sensed by the sensing unit are larger than the at least one threshold to indicate that a solid cover is close to the panel.

8. The proximity sensing apparatus as claimed in claim 6, wherein the processing unit determines that the reflected first light signals and the reflected second light signals sensed by the sensing unit are both larger than the at least one threshold to indicate that a hand is close to the panel.

9. The proximity sensing apparatus as claimed in claim 1, further comprising a light-emitting module comprising the first light-emitting unit and the second light-emitting unit; wherein the first light-emitting unit and the second light-emitting unit are at the opposite corner inside the light-emitting module, and the first light signals and the second light signals are emitted through one of the plurality of transparent areas at plurality of different angles.

10. The proximity sensing apparatus as claimed in claim 1, wherein the first light-emitting unit and the second light-emitting unit are infrared light-emitting diodes (IR LEDs).

11. A proximity sensing method, comprising the following steps:
    providing a panel with a plurality of transparent areas;
    emitting a plurality of first light signals through one of the plurality of transparent areas by a first light-emitting unit being located at one side of the panel;
    emitting a plurality of second light signals through one of the plurality of transparent areas by a second light-emitting unit being located at the same side as the first light-emitting unit of the panel; and
    sensing the reflected first light signals or the reflected second light signals reflected by an object by a sensing unit being located at the same side as the first light-emitting unit of the panel, wherein the reflected first light signals or the reflected second light signals passing through one of the plurality of transparent areas;
    wherein the sensing unit is closer to the first light-emitting unit than to the second light-emitting unit.

12. The proximity sensing method as claimed in claim 11, wherein the first light-emitting unit, the second light-emitting unit and the sensing unit is in an L shape, the sensing unit is in a corner of the L shape, and the first light-emitting unit and the second light-emitting unit are in two ends of the L shape respectively.

13. The proximity sensing method as claimed in claim 11, wherein the first light-emitting unit is located at one side of the sensing unit, and the second light-emitting unit is located at the other side of the sensing unit.

14. The proximity sensing method as claimed in claim 11, wherein the first light-emitting unit and the second light-emitting unit are both located at one side of the sensing unit.

15. The proximity sensing method as claimed in claim 11, wherein the first light-emitting unit and the second light-emitting unit sequentially emit the plurality of first light signals and the plurality of second light signals respectively.

16. The proximity sensing method as claimed in claim 11, further comprising the following steps:
    determining whether the reflected first light signals or the reflected second light signals sensed by the sensing unit is larger than at least one threshold by a processing unit.

17. The proximity sensing method as claimed in claim 16, wherein the processing unit determines that the reflected first light signals sensed by the sensing unit are larger than the at least one threshold to indicate that a solid cover is close to the panel.

18. The proximity sensing method as claimed in claim 16, wherein the processing unit determines that the reflected first light signals and the reflected second light signals sensed by the sensing unit are both larger than the at least one threshold to indicate that a hand is close to the panel.

19. The proximity sensing method as claimed in claim 11, further comprising a light-emitting module comprising the first light-emitting unit and the second light-emitting unit; wherein the first light-emitting unit and the second light-emitting unit are at the opposite corner inside the light-emitting module, and the first light signals and the second light signals are emitted through one of the plurality of transparent areas at plurality of different angles.

20. The proximity sensing method as claimed in claim 11, wherein the first light-emitting unit and the second light-emitting unit are infrared light-emitting diodes (IR LEDs).

* * * * *